(12) United States Patent
Zeller et al.

(10) Patent No.: US 12,007,460 B2
(45) Date of Patent: Jun. 11, 2024

(54) ACTUATING A MAGNETIC RESONANCE DEVICE WITH COMPENSATED MAXWELL PHASE

(71) Applicant: Siemens Healthcare GmbH, Erlangen (DE)

(72) Inventors: Mario Zeller, Erlangen (DE); Kun Zhou, Shenzhen (CN); Dominik Paul, Bubenreuth (DE)

(73) Assignee: Siemens Healthineers AG, Forchheim (DE)

( * ) Notice: Subject to any disclaimer, the term of this patent is extended or adjusted under 35 U.S.C. 154(b) by 105 days.

(21) Appl. No.: 17/902,081

(22) Filed: Sep. 2, 2022

(65) Prior Publication Data
US 2023/0072449 A1 Mar. 9, 2023

(30) Foreign Application Priority Data
Sep. 3, 2021 (EP) .................................... 21194854

(51) Int. Cl.
*G01R 33/565* (2006.01)
*G01R 33/54* (2006.01)
*G01R 33/561* (2006.01)

(52) U.S. Cl.
CPC ..... *G01R 33/56581* (2013.01); *G01R 33/543* (2013.01); *G01R 33/5618* (2013.01)

(58) Field of Classification Search
CPC .............. G01R 33/543; G01R 33/5618; G01R 33/56581
See application file for complete search history.

(56) References Cited

U.S. PATENT DOCUMENTS

| 6,512,372 B1 | 1/2003 | Ikezaki |
| 9,746,539 B2* | 8/2017 | Eggers ............. G01R 33/56527 |
| 2007/0063704 A1* | 3/2007 | Peters ................ G01R 33/5617 324/309 |
| 2022/0357416 A1* | 11/2022 | Mugler, III ........ G01R 33/5617 |

OTHER PUBLICATIONS

Bernstein, Matt A. et al. "Concomitant Gradient Terms in Phase Contrast MR: Analysis and Correction" Magnetic Resonance in Medicine, vol. 39, No. 2, pp. 300-308, 1998.
Zhou X. Jet al: "Artifacts Induced by Concomitant Magnetic Field In Fast Spin-Echo Imaging"; Magnetic Resonance in Medicine; Wiley-Liss; US; Bd. 4 0; Nr. 4; 12. Dec. 2005; pp. 582-591; XP000781736; ISSN: 0740-3194.

* cited by examiner

*Primary Examiner* — Gregory H Curran
(74) *Attorney, Agent, or Firm* — Banner & Witcoff Ltd.

(57) ABSTRACT

A method for actuating a magnetic resonance device according to an MR control sequence, wherein the MR control sequence includes a bipolar gradient pulse between an excitation pulse and a first refocusing pulse, and the bipolar gradient pulse induces a defined Maxwell phase and generates a dephasing gradient moment for a readout gradient.

12 Claims, 3 Drawing Sheets

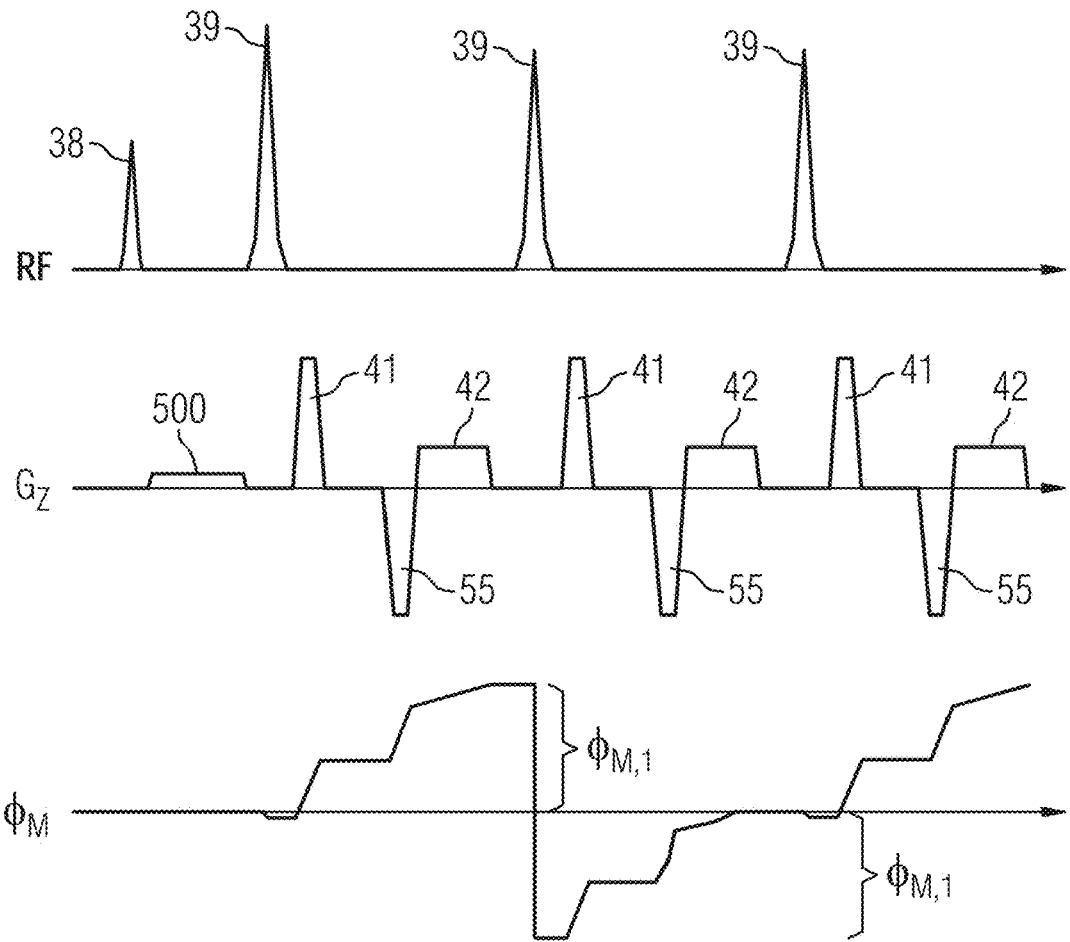
FIG 2
(Conventional)

ACTUATING A MAGNETIC RESONANCE DEVICE WITH COMPENSATED MAXWELL PHASE

TECHNICAL FIELD

The disclosure relates to a method, a magnetic resonance device, a computer program product and an electronically readable data carrier for actuating a magnetic resonance device with Maxwell phase compensation.

BACKGROUND

In a magnetic resonance device, the body of an examination object that is to be examined, in particular a patient, is usually exposed to a relatively high main magnetic field, for example 1.5 or 3 or 7 tesla, with the aid of a main magnet. In addition, gradient pulses are applied with the aid of a gradient coil unit. Gradient pulses are generated by electrical actuation of the gradient coil unit and cause a magnetic field gradient in the patient receiving area. High-frequency radio-frequency pulses (RF pulses), for example excitation pulses, are then emitted via a radio-frequency antenna unit by means of suitable antenna facilities resulting in the nuclear spins of specific atoms that are excited into resonance by these RF pulses being tilted through a defined flip angle in relation to the magnetic field lines of the main magnetic field. Upon relaxation of the nuclear spins, radio-frequency signals, so-called magnetic resonance signals (MR signals) are emitted, received by means of suitable radio-frequency antennas and then further processed. Finally, the desired image data can be reconstructed from the raw data acquired in this way.

Therefore, for specific scans, it is necessary to emit a specific magnetic resonance control sequence (MR control sequence), also called a pulse sequence, which consists of a sequence of RF pulses, for example excitation pulses, and refocusing pulses, and gradient pulses to be emitted in a suitably coordinated manner in different gradient axes along different spatial directions. Readout windows, matched in time thereto, are set to specify the time periods in which the induced MR signals are acquired. During the application of an MR control sequence, Maxwell fields occur as a concomitant of magnetic field gradients. These can result in artifacts in the reconstructed image data since they represent deviations from the desired fields. This is described for example in "Concomitant Gradient Terms in Phase Contrast MR: Analysis and Correction", Bernstein et al., MRM 39300-308 (1998).

SUMMARY

The disclosure is based on an object of disclosing a method for actuating a magnetic resonance device which compensates interference caused by Maxwell fields particularly well. The object is achieved by the features of the independent claims. Advantageous aspects are described in the subclaims.

The method according to the disclosure for actuating a magnetic resonance device according to an MR control sequence provides that the MR control sequence comprises at least one excitation pulse followed by at least two refocusing pulses. All magnetic field gradients acting on a readout axis of the readout gradient and provided between exactly two of the at least two consecutive refocusing pulses induce a first Maxwell phase. At least one readout gradient is also provided between exactly two of the at least two consecutive refocusing pulses. The MR control sequence comprises a bipolar gradient pulse having a first part and a second part of opposite polarity arranged between the excitation pulse and a first of the at least two consecutive refocusing pulses, wherein
- a Maxwell phase induced by the bipolar gradient pulse corresponds to between 40% and 60% of the first Maxwell phase,
- a gradient moment of the bipolar gradient pulse corresponds to a dephasing gradient moment for the readout gradient, and
- a duration of the bipolar gradient pulse corresponds at most to a first time interval between the excitation pulse and a first of the at least two consecutive refocusing pulses.

An excitation pulse is typically an RF pulse embodied to initially tilt a spin out of its equilibrium position. An excitation pulse typically induces a defined flip angle of 90° or less. In particular in combination with spin-echo-based MR control sequences, the excitation pulse induces a flip angle of preferably between 80° and 92°, particularly preferably a flip angle of 90°. An excitation pulse tilts a mean axis of rotation of a set of spins, defined by their mean equilibrium position, about the defined flip angle preferably in a plane perpendicular to the mean equilibrium position.

A refocusing pulse is typically an RF pulse embodied to initiate rephasing of a dephasing set of spins. A set of spins typically undergoes dephasing in the plane perpendicular to the mean equilibrium position. In particular in combination with spin-echo-based, preferably turbo-spin-echo-based (TSE-based), MR control sequences, the refocusing pulse induces a flip angle typically between 100° and 182°, preferably a flip angle between 120° and 180°, particularly preferably a flip angle of 180°. A refocusing pulse generates an echo by rephasing the dephasing set of spins, wherein the time of the echo is defined by the time interval between an excitation pulse and a first refocusing pulse; hereinafter this time interval is referred to as the first time interval. The first time interval typically corresponds to half the echo time of a spin-echo-based, in particular also a TSE-based MR control sequence. The MR control sequence comprises at least two consecutive refocusing pulses following an excitation pulse. Accordingly, following an excitation pulse at least two echoes are formed each of which emits MR signals. Accordingly, the MR control sequence is typically embodied as a TSE sequence. The time interval between two successive refocusing pulses of the at least two consecutive refocusing pulses typically corresponds to the echo time.

As part of the spatial encoding of an MR control sequence, gradient pulses are typically switched along three different spatial directions. When a gradient pulse is applied along a spatial direction, a magnetic field gradient is typically generated in this spatial direction. Simultaneously with the RF pulses, in particular simultaneously with the excitation pulse and/or a refocusing pulse, a gradient pulse can be output along a slice selection axis, wherein the gradient pulse generates a magnetic field gradient along the slice selection axis. After a refocusing pulse, in particular at a time defined by twice the first time interval, i.e., corresponding to the echo time at which rephasing of the set of spins takes place, a gradient pulse can be output along a readout axis wherein the gradient pulse generates a magnetic field gradient along the readout axis. Such a gradient pulse can be referred to as a readout gradient. After a refocusing pulse and before a readout gradient, a gradient pulse can be output along a phase-encoding axis, wherein the gradient pulse generates a magnetic field gradient along the phase-encoding axis. Such a gradient pulse can be referred to as the first phase-encoding gradient. In addition, a second phase-encoding gradient inverse to the first phase-encoding gradient can be provided between the readout gradient and a second refocusing pulse. The readout axis is preferably perpendicular to the phase-encoding axis and/or to the slice selection axis. Gradient pulses, in particular also magnetic field gradients along the mutually different axes can typically be actuated independently of one another.

RF pulses typically have a finite defined duration, which is in particular determined by a shape of the RF pulses and/or a defined flip angle to be achieved. The time interval between two RF pulses can be defined by the time interval between an end of the first of the two RF pulses and a start of the second of the two RF pulses. The time interval between two RF pulses can be defined by the time interval between the temporal midpoint of the first of the two RF pulses and the temporal midpoint of the second of the two RF pulses. The time interval between two RF pulses can be defined by the time interval between an end of the slice selection gradient accompanying the first of the two RF pulses and a start of the slice selection gradient accompanying the second of the two RF pulses. For the first time interval, the first RF pulse of the two RF pulses typically corresponds to the excitation pulse and the second RF pulse of the two RF pulses typically corresponds to the first of the at least two refocusing pulses.

The readout gradient typically generates dephasing during the application of the readout gradient. A dephasing gradient upstream and/or downstream of the readout gradient enables an echo of a simultaneously rephasing set of spins to be read out and/or a k-space line to be read out symmetrically. For this purpose, typically a dephasing gradient, which has a dephasing gradient moment, acting on the readout axis is provided between the excitation pulse and the first refocusing pulse. The dephasing gradient moment defines the gradient moment of the dephasing gradient and typically corresponds to half the gradient moment of the readout gradient. A gradient moment is typically defined as a time integral over the corresponding magnetic field gradient. Accordingly, the dephasing gradient moment typically corresponds to half the time integral over the readout gradient. The dephasing gradient is typically a gradient pulse.

A Maxwell phase typically corresponds to a phase induced by a Maxwell field, which typically occurs as a concomitant of magnetic field gradients. The Maxwell field can be defined by $$B_C(x, y, z, t) = \frac{1}{2B_0}\left[G_x^2 z^2 + G_y^2 z^2 + G_z^2 \frac{x^2 + y^2}{4} - G_x G_z xz - G_y G_z yz\right],$$

wherein $G_x$ corresponds to a magnetic field gradient along the readout axis, $G_y$ corresponds to a magnetic field gradient along the phase-encoding axis and $G_z$ corresponds to a magnetic field gradient along the slice selection axis. A Maxwell phase is typically proportional to the time integral over $B_C(x, y, z, t)$ and typically corresponds to the time integral over $B_C(x, y, z, t)$ multiplied by the gyromagnetic ratio. The first Maxwell phase is typically determined by the Maxwell field induced by all magnetic field gradients acting on the readout axis between two successive refocusing pulses of the at least two consecutive refocusing pulses.

The first Maxwell phase is preferably determined by at least the first-order Maxwell field induced by the magnetic field gradients acting on the readout axis between two successive refocusing pulses of the at least two consecutive refocusing pulses. Due to the Maxwell field, the first Maxwell phase can be proportional to the square of the readout gradient. The first Maxwell phase can in particular neglect cross terms of the Maxwell field comprising a product of two magnetic field gradients of different gradient axes.

The Maxwell phase induced by the bipolar gradient pulse, in particular by the magnetic field gradient resulting from the bipolar gradient pulse, typically corresponds to between 35% and 65%, preferably between 45% and 55%, particularly preferably half of the first Maxwell phase. The Maxwell phase of the bipolar gradient pulse preferably corresponds to the Maxwell phase induced at the time of the echo due to the readout gradient. The time of the echo typically corresponds to the time of the maximum MR signal and/or is defined by the echo time. The dephasing due to the Maxwell field induced by the readout gradient at the time of the echo, i.e., typically after half the duration of the readout gradient, typically corresponds to half the first Maxwell phase.

Due to the use of the bipolar gradient pulse, the method according to the disclosure enables dephasing necessary for the readout gradient and simultaneous compensation of the Maxwell fields. Like the readout gradient, the bipolar gradient pulse is provided on the readout axis. A Maxwell phase based on the readout gradient and the bipolar gradient pulse has a mainly quadratic dependence on the corresponding magnetic field gradients. Accordingly, the first part and the second part of the bipolar gradient pulse contribute independently and equally to the Maxwell phase generated by the bipolar gradient pulse. The linear dependence of the gradient moment on a magnetic field gradient causes the gradient moment of the second part to at least partially cancel the gradient moment of the first part due to the different polarity. Consequently, a corresponding choice of the first part and the second part enables the realization of a defined Maxwell phase on the one hand, and a defined gradient moment, in particular the dephasing gradient moment, on the other hand. Herein, it can simultaneously be ensured by maintaining the first time interval that the bipolar gradient does not require any adjustment of the echo time.

The elimination of the Maxwell phase during the readout process, i.e., during the readout gradient, prevents artifacts such as ghosting and signal voids in the image data. In addition, the bipolar gradient pulse can be selected such that an amplitude of the first part and/or the second part of the bipolar gradient pulse is minimized and/or the magnitude of the amplitude of the first part and the second part of the bipolar gradient pulse is the same. The use of a bipolar gradient pulse on the readout axis also only requires low rise and fall rates of the magnetic field gradients. This results in low peripheral nerve stimulation and little additional heating of the gradient coil unit. In addition, the method according to the disclosure can also be applied in combination with less powerful and less expensive gradient coil units.

One aspect of the method provides that the first part of the bipolar gradient pulse has the same polarity as the readout gradient. The MR control sequence is preferably embodied as a TSE-based MR control sequence. With such MR control sequences, a dephasing gradient typically has the same polarity as the readout gradient. The dephasing gradient and the readout gradient act along the readout axis. Accordingly, the first part of the bipolar gradient pulse has a gradient moment, which at least corresponds to the dephasing gradient moment. The gradient moment of the second part of the bipolar gradient pulse typically counteracts the gradient moment of the first part of the bipolar gradient pulse so that the total gradient moment of the bipolar gradient pulse corresponds to the dephasing gradient moment. This aspect represents a minor change from a conventional dephasing gradient and is accordingly robust and easy to implement.

One aspect of the method provides that at least two readout gradients are provided between exactly two of the at least two consecutive refocusing pulses and the dephasing gradient moment for the readout gradient only takes account of the first readout gradient of the at least two readout gradients. The MR control sequence preferably comprises a plurality of refocusing pulses after the excitation pulse. The two readout gradients typically differ in terms of their amplitude and/or their time interval to the preceding refocusing pulse. The two readout gradients are preferably provided after each refocusing pulse in each case. The MR control sequence comprises a second dephasing gradient having a dephasing gradient moment required for the second readout gradient of the at least two readout gradients, wherein the second dephasing gradient is provided after each refocusing pulse after the second readout gradient. The second dephasing gradient can also be provided after each refocusing pulse between the first readout gradient of the at least two readout gradients and the second readout gradient of the at least two readout gradients. The second dephasing gradient is typically effective at the temporal midpoint between two successive refocusing pulses and/or arranged at the temporal midpoint between two successive refocusing pulses. Without the use of the bipolar gradient pulse according to the disclosure, the Maxwell phase can be different after each refocusing pulse, in particular at each first readout gradient of the at least two readout gradients and at each second readout gradient of the at least two readout gradients, which may lead to strong Maxwell fields and artifacts such as ghosting and signal voids.

One aspect of the method provides that the MR control sequence is embodied as a DIXON sequence or as a turbo-gradient-spin-echo sequence. An MR control sequence embodied in this way is characterized in that at least two refocusing pulses are provided after an excitation pulse and at least two readout gradients are provided between two adjacent refocusing pulses. In particular with the DIXON sequence, the readout gradients have an above-average amplitude and therefore a resulting first Maxwell phase is particularly large. Without the use of the bipolar gradient pulse according to the disclosure, the influence of the Maxwell phase would be particularly strong, in particular on the MR signal with the opposite phase and intensify artifacts in resulting fat and water images. Consequently, the use of the bipolar gradient pulse according to the disclosure is particularly advantageous in combination with a DIXON sequence.

One aspect of the method provides that only the bipolar gradient pulse is provided between the excitation pulse and the first of the at least two consecutive refocusing pulses on the readout axis of the readout gradient. This aspect ensures that all preparations required for the course of the MR control sequence and already possible before the first refocusing pulse on the readout axis are integrated in the bipolar gradient pulse. Consequently, a duration of the bipolar gradient pulse can correspond to the first time interval and make optimal use of a rest period between the excitation pulse and the first refocusing pulse. Consequently, amplitudes of the first part and the second part of the bipolar gradient pulse can be selected to be as low as possible, which also avoids fast and strong switching cycles when the bipolar gradient pulse is applied. If a bipolar gradient were introduced to compensate a Maxwell phase in addition to a dephasing gradient already present for the readout gradient, higher amplitudes, more switching cycles and stronger rise and fall rates of the magnetic field gradients would be required compared to this aspect. Consequently, this aspect enables particularly efficient compensation of the first Maxwell phase.

One aspect of the method provides that the bipolar gradient pulse has a duration of more than 50% and less than 95% of the first time interval. The bipolar gradient pulse typically has a duration of more than 60%, preferably more than 70%, particularly preferably more than 80% of the first time interval. The bipolar gradient pulse typically has a duration of less than 98%, preferably less than 95%, particularly preferably less than 90% of the first time interval. This aspect enables particularly good utilization of the first time interval. In particular, according to this aspect, the amplitudes of the first part of the bipolar gradient pulse and the second part of the bipolar gradient pulse can be reduced and/or minimized. This reduces heating and/or peripheral nerve stimulation of an examination object. In particular, particularly good use is made of the rest period on the readout axis between the excitation pulse and the first refocusing pulse without the need to change the echo time.

One aspect of the method provides that the method comprises providing the MR control sequence according to the following steps:
  providing the excitation pulse followed by the at least two consecutive refocusing pulses and the at least one readout gradient,
  providing an initial dephasing gradient corresponding to the readout gradient having the dephasing gradient moment,
  transforming the initial dephasing gradient to the first part of the bipolar gradient pulse, comprising changing an amplitude of the initial dephasing gradient and changing a duration of the initial dephasing gradient, in particular taking account of the first time interval, under the condition that a Maxwell phase induced by the first part of the bipolar gradient pulse corresponds to a Maxwell phase induced by the initial dephasing gradient.

The initial dephasing gradient is typically a gradient pulse along the readout axis. The initial dephasing gradient typically has the same polarity as the readout gradient and/or the first part of the bipolar gradient pulse. The provision of the initial dephasing gradient can comprise ascertaining the initial dephasing gradient based on the readout gradient and/or a dephasing gradient moment required for the readout gradient. The provision of the RF pulses and/or the initial dephasing gradient can take place as part of a provision of a conventional MR control sequence. The change in the amplitude of the initial dephasing gradient can comprise a reduction or increase in amplitude. The change in the duration of the initial dephasing gradient can comprise a reduction or increase in the duration. A reduction in the amplitude of the initial dephasing gradient toward the first part of the bipolar gradient pulse while maintaining the Maxwell phase is typically accompanied by an extension of the duration, wherein the gradient moment of the first part of the bipolar gradient pulse becomes greater than the dephasing gradient moment. An extension of the amplitude of the initial dephasing gradient toward the first part of the bipolar gradient pulse while maintaining the Maxwell phase is typically accompanied by a shortening of the duration, wherein the gradient moment of the first part of the bipolar gradient pulse becomes smaller than the dephasing gradient moment. The cause lies in the quadratic dependence of the Maxwell phase and the linear dependence of the gradient moment on the amplitude. This aspect enables the first part of the bipolar gradient pulse to be generated in a simple manner.

One aspect of the method provides that the transformation takes place under the condition that the gradient moment of the first part of the bipolar gradient pulse corresponds to the dephasing gradient moment minus the gradient moment of the second part of the bipolar gradient pulse. This aspect ensures that the bipolar gradient has the dephasing gradient moment required for the dephasing of the gradient moment.

One aspect of the method additionally comprises
providing the first Maxwell phase, and
defining the second part of the bipolar gradient pulse, wherein the Maxwell phase induced by the second part of the bipolar gradient pulse corresponds to half the first Maxwell phase minus the Maxwell phase of the initial dephasing gradient. The provision of the first Maxwell phase can comprise determining the first Maxwell phase based on the readout gradient. This aspect ensures that the bipolar gradient has a Maxwell phase suitable for compensating the first Maxwell phase. In addition, this aspect enables simple and robust generation of the second part of the bipolar gradient pulse.

One aspect of the method provides that the definition of the second part of the bipolar gradient pulse takes place under the condition that the duration of the second part of the bipolar gradient pulse corresponds to between 50% and 95% of the time interval between the initial dephasing gradient and a first of the at least two consecutive refocusing pulses.

The time interval between the initial dephasing gradient and the first refocusing pulse can correspond to the duration between the end of the initial dephasing gradient and the start of the first refocusing pulse and/or the start of a slice selection gradient accompanying the first refocusing pulse. The time interval between the initial dephasing gradient and the first refocusing pulse can be defined by the time interval between the temporal midpoint of the initial dephasing gradient and the temporal midpoint of the first refocusing pulse. The duration of the second part of the bipolar gradient pulse is preferably at least 60% and/or at most 90%, particularly preferably at least 70% and/or at most 80% of the time interval between the initial dephasing gradient and the first refocusing pulse. Consequently, the second part of the bipolar gradient pulse can make optimal use of a rest period between the initial dephasing gradient and the first refocusing pulse. This avoids a change in the echo time.

The transformation of the initial dephasing gradient to the first part and/or the determination of the second part of the bipolar gradient pulse can take place deterministically under fixed boundary conditions, such as, for example, a defined duration of the second part of the bipolar gradient pulse. The transformation of the initial dephasing gradient to the first part and/or the determination of the second part of the bipolar gradient pulse can take place iteratively with respect to an optimum comprising, for example, a minimum amplitude of the bipolar gradient pulse.

Furthermore, the disclosure is based on a magnetic resonance device with a control unit comprising an actuating unit. The actuating unit is embodied to execute a method according to the disclosure for actuating a magnetic resonance device.

For this purpose, the actuating unit typically has an input, a processor unit and an output. Via the input, the actuating unit can be provided with an MR control unit and/or an excitation pulse followed by the at least two consecutive refocusing pulses, the at least one readout gradient and an initial dephasing gradient and/or a first Maxwell phase. Further functions, algorithms or parameters required in the method can be provided to the actuating unit via the input. The bipolar gradient pulse and/or further results of an aspect of the method according to the disclosure can be provided via the output. The actuating unit can be integrated into the magnetic resonance device. The actuating unit can also be installed separately from the magnetic resonance device. The actuating unit can be connected to the magnetic resonance device.

The magnetic resonance device comprises a main magnet for generating a main magnetic field. The main magnetic field is typically between 0.1 tesla and 7 tesla, in particular 1.5 tesla or 3 tesla. The main magnetic field is preferably less than 1.5 tesla, preferably less than 1 tesla, particularly preferably less than 0.8 tesla. The main magnetic field can be between 0.4 tesla and 0.7 tesla, preferably between 0.5 tesla and 0.6 tesla. The actuation according to the disclosure of such a magnetic resonance device is particularly advantageous, since the intensity of the Maxwell fields is inversely proportional to a strength of the main magnetic field. Consequently, the lower the main magnetic field, the higher the eddy currents that occur due to Maxwell fields in conventional actuation of a magnetic resonance device. The method according to the disclosure eliminates eddy currents due to Maxwell fields and is therefore particularly advantageous with main magnets having a lower strength.

Aspects of the magnetic resonance device according to the disclosure are embodied analogously to the aspects of the method according to the disclosure. The magnetic resonance device can have further control components necessary and/or advantageous for executing a method according to the disclosure. The magnetic resonance device can also be embodied to send control signals and/or receive and/or process control signals in order to execute a method according to the disclosure. The actuating unit is preferably part of the control unit of the magnetic resonance device according to the disclosure. A memory unit of the actuating unit can be used to store computer programs and further software by means of which the processor unit of the actuating unit automatically controls and/or executes a method sequence of a method according to the disclosure.

A computer program product according to the disclosure can be loaded directly in a memory unit of a programmable actuating unit and has program code means for executing a method according to the disclosure when the computer program product is executed in the actuating unit. This enables the method according to the disclosure to be executed quickly, identically repeatedly and robustly. The computer program product is configured such that it can execute the method steps according to the disclosure by means of the actuating unit. Herein, the actuating unit must in each case fulfil the requisite conditions such as, for example, a corresponding random access memory, a corresponding graphics card or a corresponding logic unit so that the respective method steps can be executed efficiently. The computer program product is, for example, stored on an electronically readable medium or held on a network or server from where it can be loaded into the processor of a local actuating unit, which is directly connected to the magnetic resonance device or can be embodied as part of the magnetic resonance device. Furthermore, control information of the computer program product can be stored on an electronically readable data carrier. The control information of the electronically readable data carrier can be embodied such that it performs a method according to the disclosure when the data carrier is used in an actuating unit of a magnetic resonance device. Examples of electronically readable data carriers are DVDs, magnetic tapes or USB sticks on which electronically readable control information, in particular software, is stored. When this control information (software) is read from the data carrier and stored in a control unit and/or actuating unit of a magnetic resonance device, all aspects according to the disclosure of the above-described methods can be performed.

Furthermore, the disclosure is based on an electronically readable data carrier on which a program provided to execute a method for actuating a magnetic resonance device is held.

The advantages of the magnetic resonance device according to the disclosure, the computer program product according to the disclosure and the electronically readable data carrier according to the disclosure substantially correspond to the advantages of the method according to the disclosure for actuating a magnetic resonance device as set forth in detail above. Features, advantages or alternative aspects mentioned herein can also be transferred to the other claimed subject matter and vice versa.

BRIEF DESCRIPTION OF THE DRAWINGS

Further advantages, features and details of the disclosure will emerge from the exemplary aspects described below and with reference to the drawings.

The drawings show.

DETAILED DESCRIPTION

Figure 1:
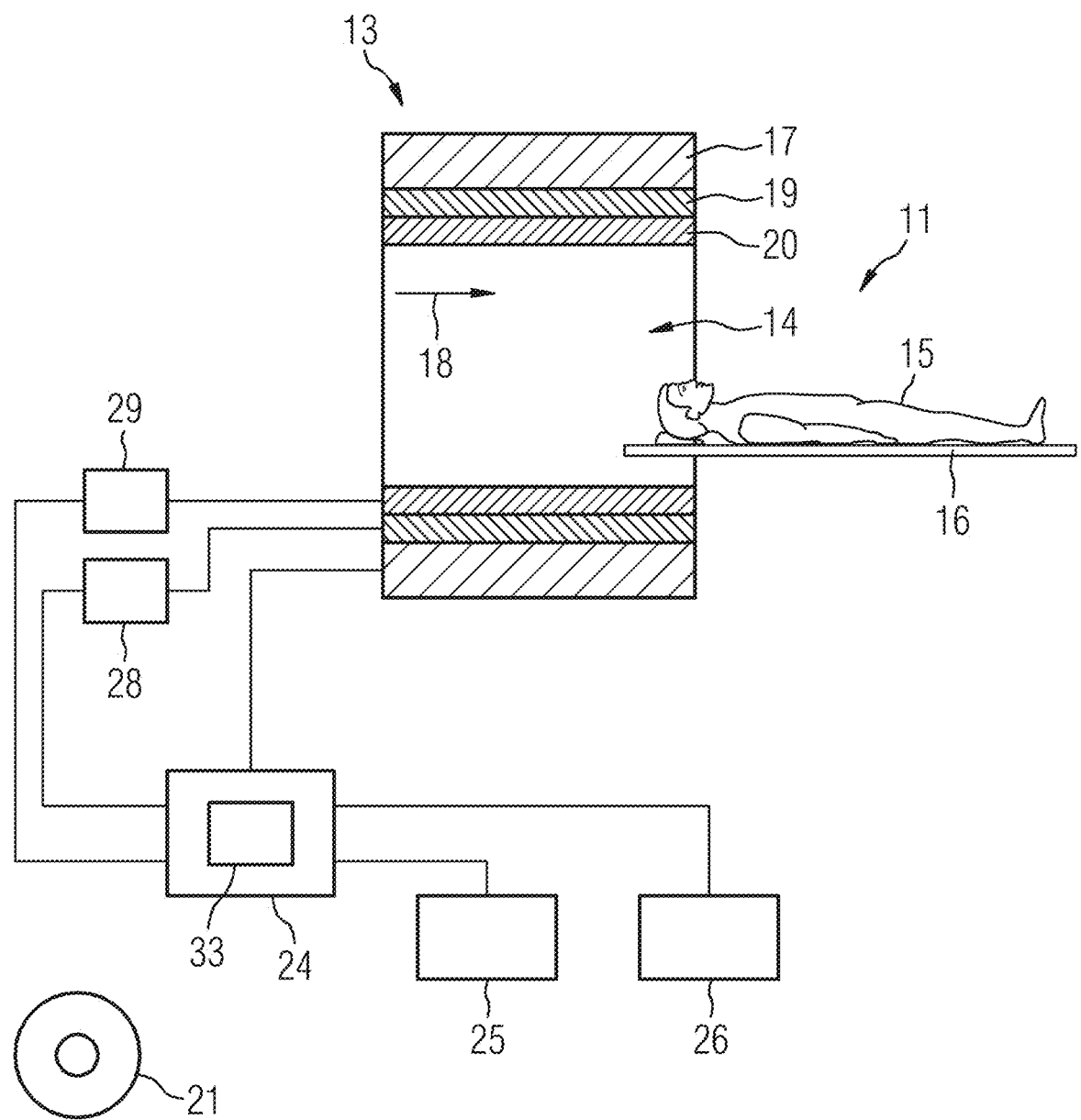
FIG. 1 a schematic view of a magnetic resonance device according to the disclosure, FIG. 2 a partial diagram of a conventional MR control sequence with resulting Maxwell phase, FIG. 3 a partial diagram of a MR control sequence for use in a first aspect of a method according to the disclosure, FIG. 4 a partial diagram of a MR control sequence for use in a second aspect of a method according to the disclosure, FIG. 5 a flowchart of a first aspect of a method according to the disclosure, and FIG. 6 a flowchart of a second aspect of a method according to the disclosure.

FIG. 1 is a schematic view of a magnetic resonance device 11 for executing a method according to the disclosure. The magnetic resonance device 11 comprises a detector unit formed by a magnet unit 13 with a main magnet 17 for generating a strong and in particular constant main magnetic field 18. In addition, the magnetic resonance device 11 has a cylindrical patient receiving area 14 for receiving an examination object 15, wherein the patient receiving area 14 is cylindrically enclosed by the magnet unit 13 in a circumferential direction. The examination object 15 can be pushed into the patient receiving area 14 by means of a patient support apparatus 16 of the magnetic resonance device 11.

The magnet unit 13 furthermore has a gradient coil unit 19 that is used for spatial encoding during imaging. The gradient coil unit 19 is actuated by means of a gradient control unit 28. Furthermore, the magnet unit 13 has a radio-frequency antenna unit 20 which, in the case shown, is embodied as a body coil permanently integrated into the magnetic resonance device 11 and a radio-frequency antenna control unit 29 for exciting polarization that arises in the main magnetic field 18 generated by the main magnet 17. The radio-frequency antenna unit 20 is actuated by the radio-frequency antenna control unit 29 and radiates high-frequency RF pulses into an examination space that is substantially formed by the patient receiving area 14.

The magnetic resonance device 11 has a control unit 24 for controlling the main magnet 17, the gradient control unit 28 and the radio-frequency antenna control unit 29. The control unit 24 controls the magnetic resonance device 11 centrally. In addition, the control unit 24 comprises a reconstruction unit, not shown in any more detail, for reconstructing medical image data that is acquired during the magnetic resonance examination. The magnetic resonance device 11 has a display unit 25. Control information such as, for example, control parameters, and reconstructed image data can be displayed on the display unit 25, for example on at least one monitor, for a user. In addition, the magnetic resonance device 11 has an input unit 26 by means of which information and/or control parameters can be entered by a user during a scan procedure. The control unit 24 can comprise the gradient control unit 28 and/or radio-frequency antenna control unit 29 and/or the display unit 25 and/or the input unit 26.

The control unit 24 furthermore comprises an actuating unit 33. In addition, the actuating unit 33 is configured to execute a method for actuating the magnetic resonance device 11 according to an MR control sequence. For this purpose, the actuating unit 33 is connected to the radio-frequency antenna control unit 29 and is in particular embodied to transmit a time sequence and/or time series of RF pulses, in particular comprising the excitation pulse 38 and the at least two refocusing pulses 39, to the radio-frequency antenna control unit 29, which is typically embodied to trigger an output of the RF pulses via the radio-frequency antenna unit 20. For this purpose, the actuating unit 33 is connected to the gradient control unit 28 and is in particular embodied to transmit a time sequence and/or time series of gradient pulses, in particular comprising the readout gradient 41 and the bipolar gradient 50 to the gradient control unit 28, which is typically embodied to trigger an output of the gradient pulses via the gradient coil unit 19. The gradient pulses and the RF pulses typically operate in the patient receiving area 14. The actuating unit 33 has computer programs and/or software, which can be loaded directly in a memory unit of the actuating unit 33, not shown in greater detail, with program means for executing a method for actuating the magnetic resonance device 11 according to an MR control sequence when the computer programs and/or software are actuated in the actuating unit 33. For this purpose, the actuating unit 33 has a processor, not shown in greater detail, configured to execute the computer programs and/or software. Alternatively, the computer programs and/or software can also be stored on an electronically readable data carrier 21 embodied separately from the control unit 24 and/or actuating unit 33, wherein data access from the actuating unit 33 to the electronically readable data carrier 21 can take place via a data network.

The magnetic resonance device 11 depicted can obviously comprise further components that are usually comprised by magnetic resonance devices 11. In addition, the general mode of operation of a magnetic resonance device 11 is known to the person skilled in the art so no detailed description of the further components will be given. Thus, the magnetic resonance device 11 is configured together with the actuating unit 33 to execute a method according to the disclosure.

A method for actuating the magnetic resonance device 11 according to an MR control sequence can also be provided in the form of a computer program product that implements the method on the actuating unit 33 when it is executed on the actuating unit 33. Similarly, an electronically readable data carrier 21 can be provided with electronically readable control information stored thereupon comprising at least one computer program product as described above and which is embodied to perform the described method when the electronically readable data carrier 21 is used in an actuating unit 33 of a magnetic resonance device 11.

FIG. 2 is a partial diagram of a conventional MR control sequence with resulting Maxwell phase. The partial diagram comprises the RF pulses (RF) and gradients $G_z$ acting in the readout direction, i.e., along the readout axis, here designated the z-direction, over time. No depiction of the gradients acting in the phase encoding direction and in the slice selection direction is given here or in the following FIGS. 3 and 4. The conventional MR control sequence comprises at least one excitation pulse 38 followed by at least two consecutive refocusing pulses 39. A readout gradient 41, 55 is typically switched between two successive consecutive refocusing pulses 39 at the echo time for spatial encoding in the readout direction. An MR control sequence can also be embodied as a DIXON sequence and comprise at least two readout gradients 41, 55 between two successive consecutive refocusing pulses 39. In this case, typically, a second dephasing gradient 42 required for the second readout gradient 55 of the at least two readout gradients 41, 55 is similarly arranged between the two successive consecutive refocusing pulses 39. The conventional i.e., initial, dephasing gradient 500 required for the first readout gradient 41 of the at least two readout gradients 41, 55 is typically arranged between the excitation pulse 38 and the first refocusing pulse of the at least two refocusing pulses 39.

The time profile of the Maxwell phase $\phi_M$ induced by the gradients $G_z$ acting in the readout direction is depicted. The first Maxwell phase $\phi_{M,1}$, in each case accumulated between two successive consecutive refocusing pulses 39, is typically the same for each pair of consecutive refocusing pulses 39. However, the absolute magnitude of the Maxwell phase $\phi_M$ at the times of the first readout gradient 41 differs in the time profile of the MR control sequence. Similarly, the absolute magnitude of the Maxwell phase $\phi_M$ differs at the times of the second readout gradients 55 in the time profile of the MR control sequence.

Figure 3:
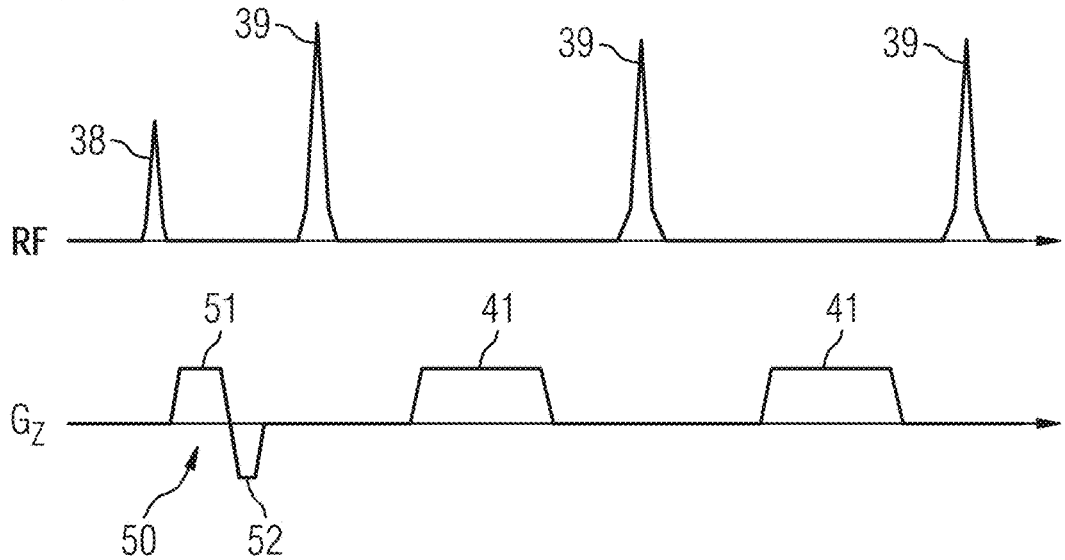

FIG. 3 shows a partial diagram of a MR control sequence for use in a first aspect of a method according to the disclosure. The MR control sequence comprises an excitation pulse 38 followed by at least two consecutive refocusing pulses 39, wherein a readout gradient 41 is provided between exactly two of the at least two consecutive refocusing pulses 39. The MR control sequence comprises a bipolar gradient pulse 50 having a first part 51 and second part 52 of opposite polarity arranged between the excitation pulse 38 and a first of the at least two consecutive refocusing pulses 39. The bipolar gradient pulse 50 is embodied such that a Maxwell phase $\phi_M$ induced by the bipolar gradient pulse 50 corresponds to between 40% and 60% of the first Maxwell phase $\phi_{M,1}$, preferably to half the first Maxwell phase $\phi_{M,1}$. The gradient moment of the bipolar gradient pulse 50 corresponds to a dephasing gradient moment for the readout gradient 41. Herein, the polarity of the first part 51 of the bipolar gradient pulse 50 has the same polarity as the readout gradient 41. The duration of the bipolar gradient pulse 50 corresponds at most to a first time interval between the excitation pulse 38 and the first refocusing pulse of the at least two refocusing pulses 39. The duration of the bipolar gradient pulse 50 is preferably between 50% and 95% of the first time interval. The bipolar gradient pulse 50 is typically the only gradient $G_z$ acting in the readout direction arranged between the excitation pulse 38 and the first refocusing pulse of the at least two refocusing pulses 39.

Figure 4:
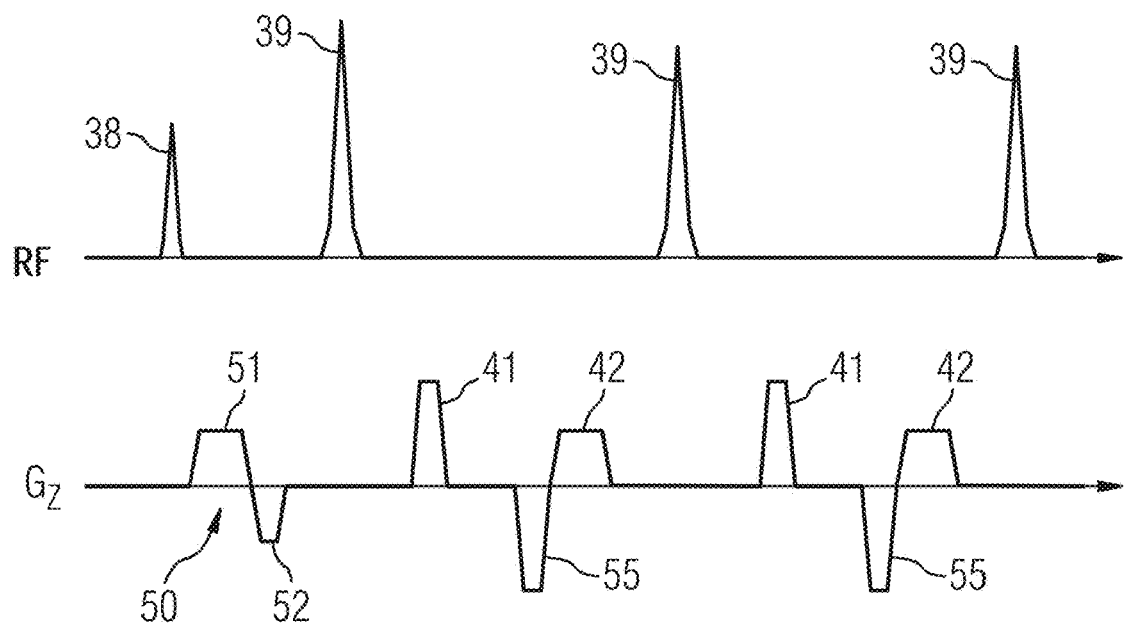

FIG. 4 shows a partial diagram of a MR control sequence for use in a second aspect of a method according to the disclosure. The second aspect differs from the first aspect in that not only one readout gradient 41 but two readout gradients 41, 55 are provided between two adjacent refocusing pulses 39 in each case. The second dephasing gradient 42 required for the second readout gradient 55 is similarly arranged between the two successive consecutive refocusing pulses 39. The gradient moment of the second dephasing gradient 42 corresponds to the gradient moment required for the second readout gradient 55, i.e., in particular to half the gradient moment corresponding to the second readout gradient 55. Herein, the gradient moment of the bipolar gradient pulse 50 corresponds to the dephasing gradient moment for the first readout gradient 41.

Figure 5:
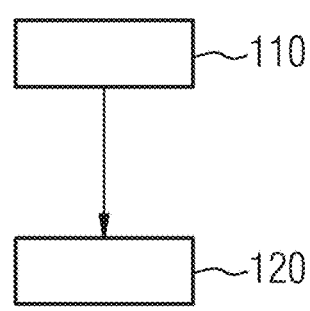

FIG. 5 shows a flowchart of a first aspect of a method according to the disclosure. In method step 110, this method comprises the provision of an MR control sequence as shown in FIG. 3 or FIG. 4. Finally in method step 120, the magnetic resonance device 11 is actuated in accordance with the MR control sequence provided.

Figure 6:
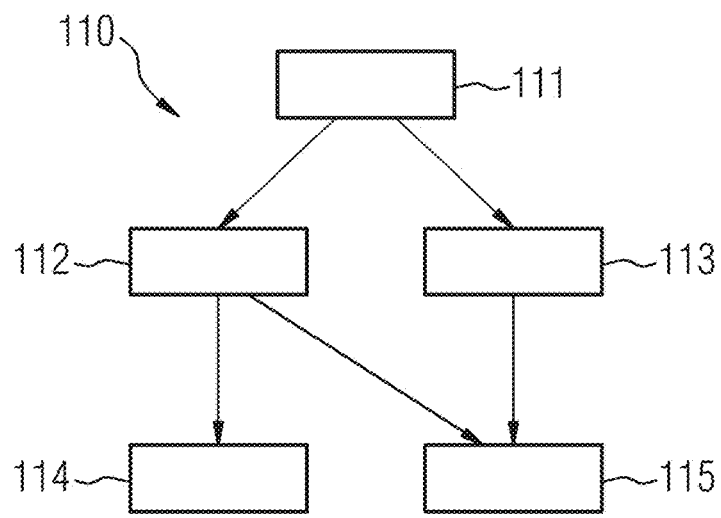

FIG. 6 shows a flowchart of a second aspect of a method according to the disclosure. Method step 110, i.e., the provision of the MR control sequence, can comprise the following method steps: method step 111 comprises the provision of the excitation pulse 38 followed by the at least two consecutive refocusing pulses 39 and the at least one readout gradient 41, 55. Method step 112 provides the provision of an initial dephasing gradient 500 corresponding to the readout gradient 41, wherein the initial dephasing gradient 500 has the dephasing gradient moment required for the readout gradient 41.

Method step 114 comprises transforming the initial dephasing gradient 500 to the first part 51 of the bipolar gradient pulse 50 comprising reducing an amplitude of the initial dephasing gradient 500 and/or an extension of a duration of the initial dephasing gradient 500, in particular taking account of the first time interval. This takes place under the conditions that a Maxwell phase induced by the first part 51 of the bipolar gradient pulse 50 corresponds to a Maxwell phase induced by the initial dephasing gradient 500 and that the gradient moment of the first part 51 of the bipolar gradient pulse 50 corresponds to the dephasing gradient moment minus the gradient moment of the second part 52 of the bipolar gradient pulse 50.

Method step 113 comprises providing the first Maxwell phase $\phi_{M,1}$. The provision of the first Maxwell phase $\phi_{M,1}$ can also comprise determining the first Maxwell phase $\phi_{M,1}$ based on the at least one readout gradient 41. In method step 115, the second part 52 of the bipolar gradient pulse 50 is determined, wherein the Maxwell phase induced by the second part 52 of the bipolar gradient pulse 50 corresponds to half the first Maxwell phase $\phi_{M,1}$ minus the Maxwell phase of the initial dephasing gradient 500. Here, the condition can apply that the duration of the second part 52 of the bipolar gradient pulse 50 corresponds to between 50% and 95% of the time interval between the initial dephasing gradient 500 and the first refocusing pulse of the at least two refocusing pulses 39.

This aspect can in particular comprise all the method steps 111, 112, 113, 114, 115 listed here. Alternatively, this aspect can also only comprise the method steps 111, 112, 114 or the method steps 111, 112, 113, 115. The actuating unit 33 is typically embodied to execute the method steps 111, 112, 113, 114, 115, in particular also the method steps 110, 120.

Although the disclosure has been illustrated and described in greater detail by the preferred exemplary aspects, the disclosure is not restricted by the disclosed examples and other variations can be derived herefrom by the person skilled in the art without departing from the scope of protection of the disclosure.

The invention claimed is:

1. A method for actuating a magnetic resonance (MR) device according to an MR control sequence comprising:
at least one excitation pulse followed by at least two consecutive refocusing pulses, wherein, between exactly two of the at least two consecutive refocusing pulses, all magnetic field gradients acting on a readout axis of the readout gradient induce a first Maxwell phase and at least one readout gradient is provided; and
a bipolar gradient pulse having a first part and a second part of opposite polarity arranged between the excitation pulse and a first of the at least two consecutive refocusing pulses, wherein a Maxwell phase induced by the bipolar gradient pulse corresponds to between 40% and 60% of the first Maxwell phase, a gradient moment of the bipolar gradient pulse corresponds to a dephasing gradient moment for the readout gradient, and a duration of the bipolar gradient pulse corresponds at most to a first time interval between the excitation pulse and a first of the at least two consecutive refocusing pulses.

2. The method as claimed in claim 1, wherein the first part of the bipolar gradient pulse has the same polarity as the readout gradient.

3. The method as claimed in claim 1, wherein the MR control sequence is embodied as a DIXON sequence or as a turbo-gradient-spin-echo sequence.

4. The method as claimed in claim 1, wherein at least two readout gradients are provided between exactly two of the at least two consecutive refocusing pulses and the dephasing gradient moment for the readout gradient only takes account of a first readout gradient of the at least two readout gradients.

5. The method as claimed in claim 1, wherein only the bipolar gradient pulse is provided between the excitation pulse and the first of the at least two consecutive refocusing pulses on the readout axis of the readout gradient.

6. The method as claimed in claim 1, wherein the bipolar gradient pulse has a duration greater than 50% and less than 95% of the first time interval.

7. The method as claimed in claim 1, further comprising providing the MR control sequence by:
providing the excitation pulse followed by the at least two consecutive refocusing pulses and the at least one readout gradient;
providing an initial dephasing gradient corresponding to the readout gradient having the dephasing gradient moment; and
transforming the initial dephasing gradient to the first part of the bipolar gradient pulse, comprising changing an amplitude of the initial dephasing gradient and/or changing a duration of the initial dephasing gradient, taking account of the first time interval, under a condition that a Maxwell phase induced by the first part of the bipolar gradient pulse corresponds to a Maxwell phase induced by the initial dephasing gradient.

8. The method as claimed in claim 7, wherein the transformation takes place under a condition that the gradient moment of the first part of the bipolar gradient pulse corresponds to the dephasing gradient moment minus the gradient moment of the second part of the bipolar gradient pulse.

9. The method as claimed in claim 7, further comprising:
providing the first Maxwell phase; and
defining the second part of the bipolar gradient pulse, wherein the Maxwell phase induced by the second part of the bipolar gradient pulse corresponds to half the first Maxwell phase minus the Maxwell phase of the initial dephasing gradient.

10. The method as claimed in claim 9, wherein a definition of the second part of the bipolar gradient pulse takes place under the condition that the duration of the second part of the bipolar gradient pulse corresponds to between 50% and 95% of the time interval between the initial dephasing gradient and a first of the at least two consecutive refocusing pulses.

11. A magnetic resonance device with a control unit comprising an actuating unit configured to execute a method for actuating the magnetic resonance device as claimed in claim 1.

12. A non-transitory electronically readable data carrier on which a program is stored, which is embodied such that the program performs the method for actuating a magnetic resonance device as claimed in claim 1 when the data carrier is used in an actuating unit.

* * * * *